(12) United States Patent
Chen et al.

(10) Patent No.: US 11,988,246 B2
(45) Date of Patent: May 21, 2024

(54) AXIAL-ROTATION LOCKING-MECHANISM ASSEMBLY

(71) Applicant: Quanta Computer Inc., Taoyuan (TW)

(72) Inventors: Chao-Jung Chen, Taoyuan (TW); Chih-Wei Lin, Taoyuan (TW); Che-Hung Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/829,468

(22) Filed: Jun. 1, 2022

(65) Prior Publication Data
US 2023/0340979 A1 Oct. 26, 2023

Related U.S. Application Data (60) Provisional application No. 63/333,418, filed on Apr. 21, 2022.

(51) Int. Cl.
| | | |
|---|---|---|
| *E05C 1/14* | (2006.01) | |
| *F16B 5/06* | (2006.01) | |
| *F16H 37/12* | (2006.01) | |
| *H05K 7/14* | (2006.01) | |
| *E05C 1/00* | (2006.01) | |

(52) U.S. Cl.
CPC .................. *F16B 5/06* (2013.01); *E05C 1/14* (2013.01); *F16H 37/124* (2013.01); *H05K 7/1489* (2013.01)

(58) Field of Classification Search
CPC ......... Y10T 292/0971; Y10T 292/0977; Y10T 292/1016; Y10T 292/0863; Y10T 292/0864; Y10T 292/0867; Y10T 292/089; E05C 1/00; E05C 1/02; E05C 1/04; E05C 1/06; E05C 1/14; E05C 1/16
See application file for complete search history.

(56) References Cited

U.S. PATENT DOCUMENTS

| | | | | |
|---|---|---|---|---|
| 129,527 | A | * 7/1872 | Calhoun | ................... E05C 1/16 |
| | | | | 16/202 |
| 341,557 | A | * 5/1886 | Cory | ..................... E05B 63/044 |
| | | | | 292/57 |

(Continued)

FOREIGN PATENT DOCUMENTS

| | | | |
|---|---|---|---|
| DE | 848762 | C * | 9/1952 |
| DE | 202016005712 | U1 * | 2/2017 |

(Continued)

*Primary Examiner* — Carlos Lugo
(74) *Attorney, Agent, or Firm* — NIXON PEABODY LLP (57) ABSTRACT

An axial-rotation locking-mechanism assembly includes a handle, a locking assembly, and a shaft. The locking assembly includes a locking element and a cam mechanism. The shaft is operatively connected to the handle and the locking assembly. When the handle is rotated in a first direction, the shaft is rotated in a first direction and drives the cam mechanism to move the locking element in a first axial direction. When the handle is rotated in a second direction, the shaft is rotated in a second direction and drives the cam mechanism to move the locking element in a second axial direction. The second direction is the opposite of the first direction. The first axial direction is the opposite of the second direction.

12 Claims, 5 Drawing Sheets

(56) References Cited

U.S. PATENT DOCUMENTS

| | | | | |
|---|---|---|---|---|
| 1,588,490 A | * | 6/1926 | Murray | E05C 17/38 |
| | | | | 292/58 |
| 1,660,515 A | * | 2/1928 | Maxon | E05C 1/14 |
| | | | | 292/DIG. 37 |
| 4,195,867 A | * | 4/1980 | Baillie | E05C 1/10 |
| | | | | 70/81 |
| 7,097,214 B2 | * | 8/2006 | Tsai | E05B 65/0864 |
| | | | | 292/156 |

FOREIGN PATENT DOCUMENTS

| | | | | | |
|---|---|---|---|---|---|
| GB | 191203902 A | * | 1/1913 | | |
| GB | 191503562 A | * | 9/1915 | | |
| GB | 753150 A | * | 7/1956 | | |
| GB | 2180586 A | * | 4/1987 | | E05C 1/06 |

\* cited by examiner

AXIAL-ROTATION LOCKING-MECHANISM ASSEMBLY

CROSS REFERENCE TO RELATED APPLICATIONS

This application claims priority to and the benefits of U.S. Provisional Patent No. 63/333,418 filed on Apr. 21, 2022 entitled "Universal Axial-Rotation Locking Mechanism", the contents of which are hereby incorporated by reference herein in their entirety.

FIELD OF THE INVENTION

The present invention relates generally to locking-mechanism assemblies and, more specifically, to locking-mechanism assemblies that are used in tight spaces such as inside server or storage chassis.

BACKGROUND OF THE INVENTION

Server or storage chassis include numerous electronic components that are located and placed in tight areas that can be difficult to access. These electronic components are often locked in place. One device for maintaining the electronic components in place is a locking mechanism. The locking mechanism desirably is able to lock and unlock to access the electronic components during repair or replacement. The locking mechanisms also need to be designed or configured to be on the smaller side because of the limited height and space in, for example, server or storage chassis.

Thus, there is a need for a locking-mechanism assembly that can be locked/unlocked quickly with a minimal footprint.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, an axial-rotation locking-mechanism assembly includes a handle, a locking assembly and a shaft. The locking assembly includes a locking element and a cam mechanism. The shaft is operatively connected to the handle and the locking assembly. When the handle is rotated in a first direction, the shaft is rotated in a first direction and drives the cam mechanism to move the locking element in a first axial direction. When the handle is rotated in a second direction, the shaft is rotated in a second direction and drives the cam mechanism to move the locking element in a second axial direction. The second direction is the opposite of the first direction. The first axial direction is the opposite of the second direction.

According to a configuration of the above implementation, the axial-rotation locking-mechanism assembly further comprises a base.

According to a configuration of the above implementation, the axial-rotation locking-mechanism assembly further comprises a housing.

According to another configuration of the above implementation, the first direction is counter-clockwise.

According to a further configuration of the above implementation, the cam mechanism has a generally C-shaped exterior surface along which the shaft moves.

In a further aspect of the above implementation, the shaft includes a generally round portion and an extension extending therefrom, the extension of the shaft moving along the cam mechanism.

In a further aspect of the above implementation, the shaft includes a generally round portion and an extension extending therefrom. The cam mechanism has a generally C-shaped exterior surface. The extension of the shaft moves along the generally C-shaped exterior surface.

In yet a further aspect of the above implementation, the locking element comprises a metal. In a further implementation, the locking element comprises a polymeric material.

According to another aspect of the present disclosure, a method of locking and unlocking a component including providing an axial-rotation locking-mechanism assembly. The axial-rotation locking-mechanism assembly includes a handle, a locking assembly including a locking element and a cam mechanism, and a shaft operatively connected to the handle and the locking assembly. The handle is rotated in a first direction to cause the shaft to be rotated in a first direction. In response to rotating the handle, the cam mechanism is driven to move the locking element in an axial direction.

According to a configuration of the above implementation, the axial-rotation locking-mechanism assembly further includes a base.

According to a configuration of the above implementation, the axial-rotation locking-mechanism assembly further includes a housing.

According to another configuration of the above implementation, the first direction is counter-clockwise.

According to a further configuration of the above implementation, the cam mechanism has a generally C-shaped exterior surface along which the shaft moves.

In yet a further aspect of the above implementation, the locking element comprises a metal. In a further implementation, the locking element comprises a polymeric material.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The locking-mechanism assembly of the present invention is advantageous for several reasons. The locking-mechanism assembly can be used without or in the absence of additional tooling. Thus, the locking-mechanism assembly can be toollessly operated in locking or unlocking the locking element. This makes the service of various components easier when using the locking-mechanism assembly of the present invention. The locking-mechanism assembly is also compact with a smaller footprint and also in the space needed to unlock and lock the locking mechanism. This is especially desirable in locations (e.g., server or storage chassis) that have limited space including the height.

Figure 1A:
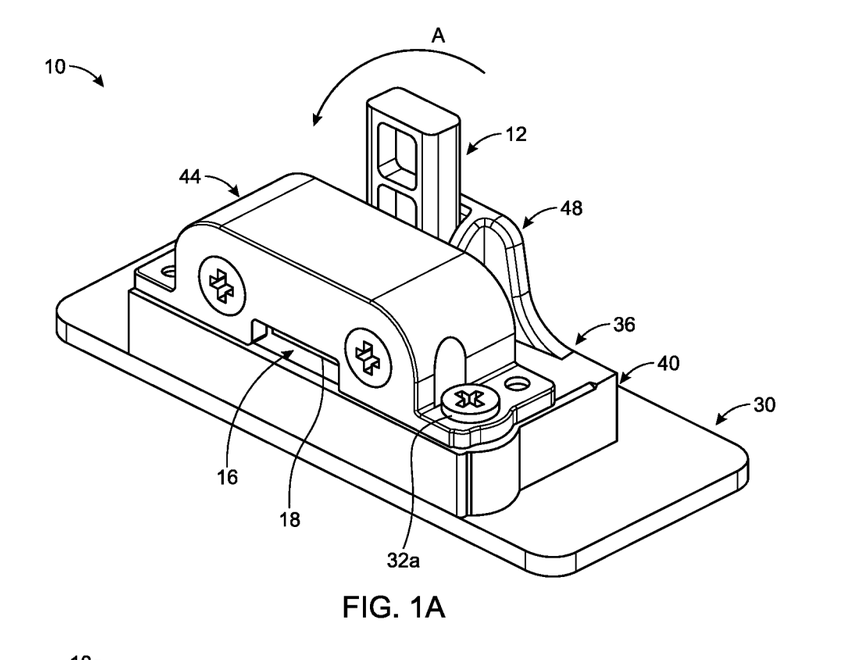
FIG. 1A is a perspective view of a locking-mechanism assembly in an unlocked position according to one embodiment.
Figure 1B:
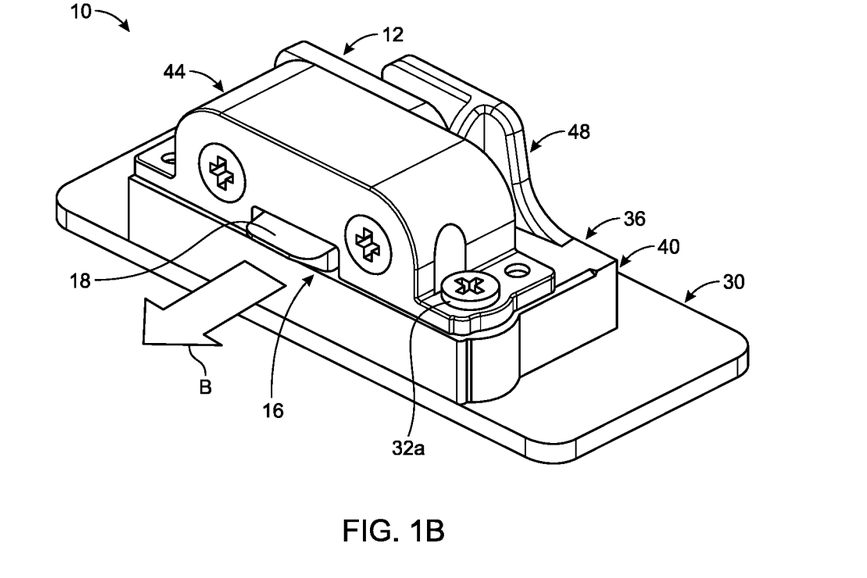
FIG. 1B is a perspective view of the locking-mechanism assembly of FIG. 1A in a locked position.
Figure 2A:
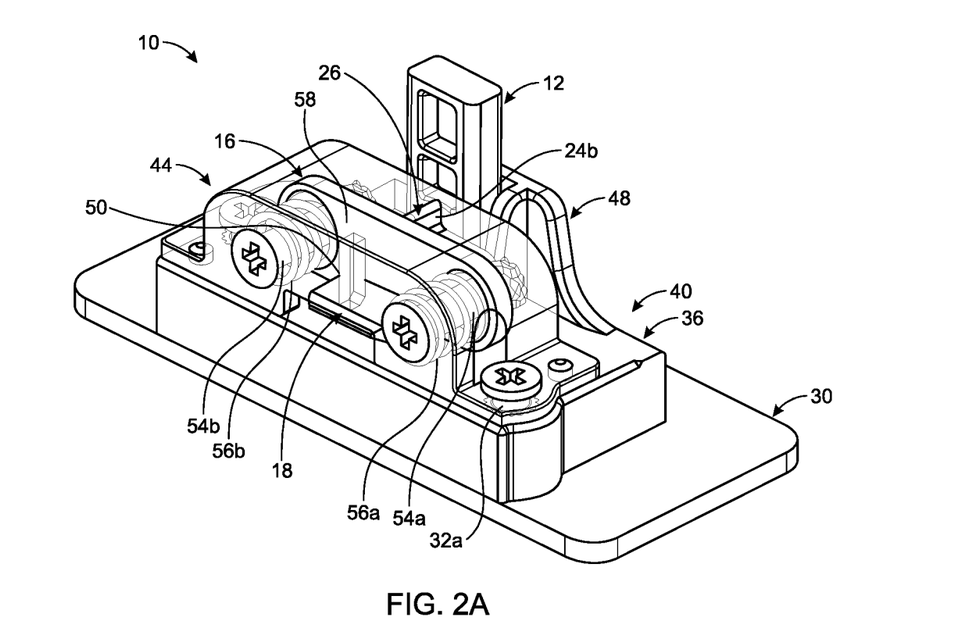
FIG. 2A is the perspective view of FIG. 1A showing a clear cover for improved clarity.
Figure 2B:
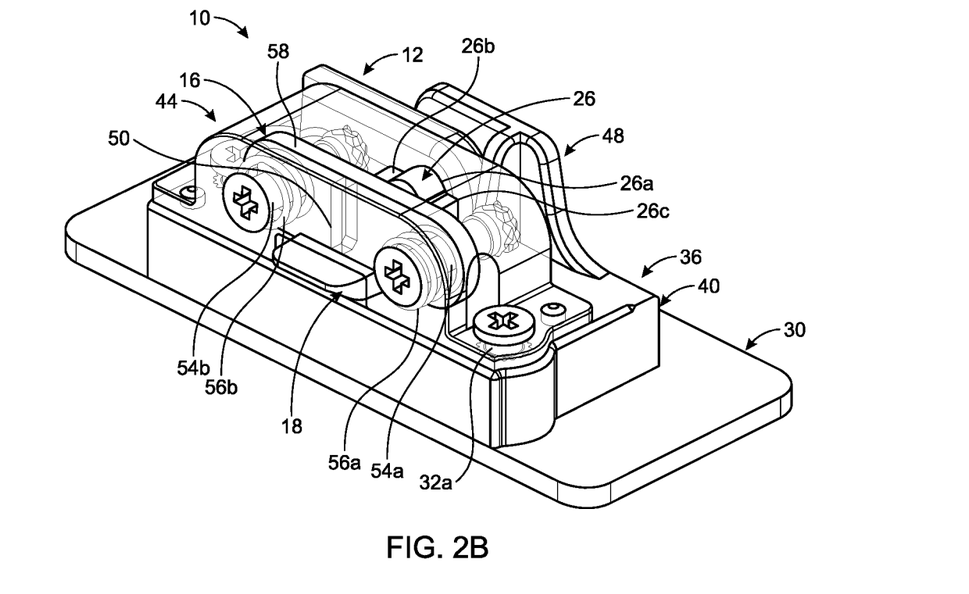
FIG. 2B is the perspective view of FIG. 1B showing a clear cover for improved clarity.
Figure 3A:
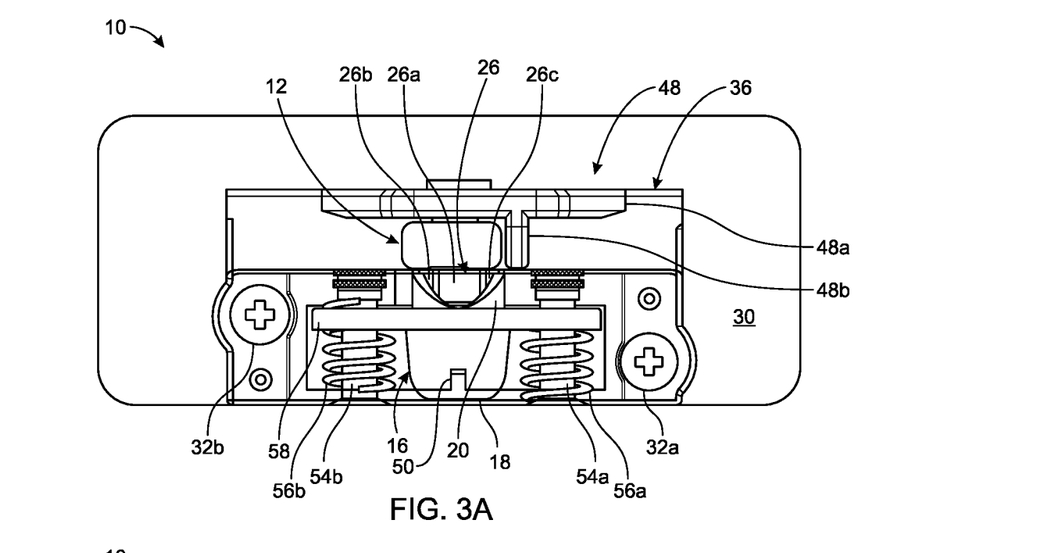
FIG. 3A is a top view of the locking-mechanism assembly of FIG. 1A in the unlocked position.
Figure 3B:
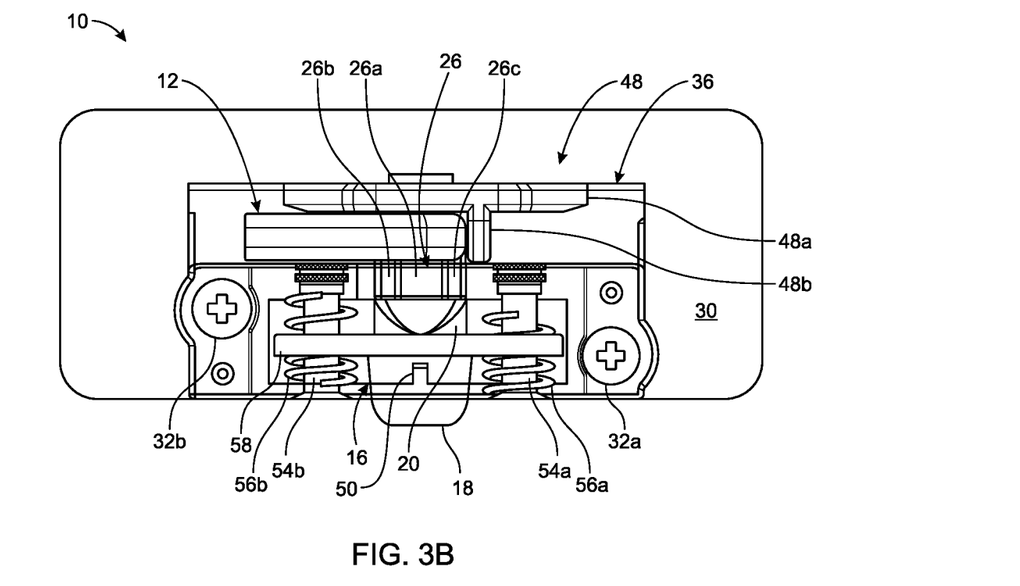
FIG. 3B is a top view of the locking-mechanism assembly of FIG. 1B in the locked position.

Referring to FIGS. 1A-3B, an axial-rotation locking-mechanism assembly 10 includes a handle or lever 12, a locking assembly 16 including a locking element 18 and a cam mechanism or a cam end portion 20 (FIGS. 3A, 3B), a shaft 26, a base 30, and housing 36. More specifically, the locking element 18 defines the cam mechanism or the cam end portion 20. The shaft 26 is operatively connected to the handle 12 and the locking assembly 16. FIGS. 1A, 2A and 3A show the axial-rotation locking-mechanism assembly 10 in an unlocked position, while FIGS. 1B, 2B and 3B show the axial-rotation locking-mechanism assembly 10 in a locked position.

The handle 12 is configured to move the locking-mechanism assembly 10 between unlocked and locked positions. The handle 12 is configured to be rotated. In this embodiment, the handle 12 is configured to be rotated in a counterclockwise direction (shown as arrow A in FIG. 1A) to unlock the locking-mechanism assembly 10. This is discussed in detail below with respect to FIGS. 4A-4C. It is also contemplated in another embodiment that the handle may be configured to rotate in a clockwise direction to unlock the locking-mechanism assembly.

As the handle 12 is rotated, this causes and results in the shaft 26 being rotated. More specifically, when the handle 12 is rotated in a first direction, the shaft 26 is rotated in a first direction and drives the cam mechanism 20 to move the locking element 18 in a first axial direction (direction of arrow B in FIG. 1B). When the handle 12 is rotated in a second direction, the shaft 26 is rotated in a second direction and drives the cam mechanism 20 to move the locking element 18 in a second axial direction (opposite of arrow B in FIG. 1B). The second direction is the opposite of the first direction, and the first axial direction is the opposite of the second axial direction.

The shaft 26 includes a generally round cross-sectional portion 26a and a plurality of extensions 26b, 26c extending from the generally round cross-sectional portion 26a as shown best in FIG. 2B. The extension 26b moves along the cam mechanism 20, which, in turn, moves the locking element 18 in a first axial direction (direction of arrow B in FIG. 1B). It is contemplated that the shaft in another embodiment may include exactly one extension therefrom.

As shown best in FIGS. 3A, 3B, the cam mechanism 20 has a generally C-shaped exterior surface along which the extension 26b of the shaft 26 moves from the position of FIG. 3A until reaching the position of FIG. 3B. It is contemplated that the cam mechanism may be of other shapes and sizes that are conducive to moving the locking element in an axial direction with assistance from the shaft.

The base 30 of the locking-mechanism assembly 10 is configured to be mounted on any surface. The base 30 is typically mounted on a flat surface, although it is contemplated that a base may be mounted on surfaces that are not flat. The base 30 may be secured by different methodologies. For example, the base 30 may be secured by using fasteners, such as screws 32a, 32b that extend through the housing 36 and the base 30 into another surface. In another embodiment, the base 30 of the locking-mechanism assembly 10 may be directly attached to another surface using, for example, screws. The base 30 is shown as being generally rectangular. The base, however, may be of other polygonal or non-polygonal shapes in other embodiments.

The housing 36 includes a base housing 40, a top cover 44, and a side support 48. The base housing 40 is attached directly to the base 30. The top cover 44 assists in protecting the locking assembly 16 of the locking-mechanism assembly 10 from the environment. The top cover 44 also includes a downward extension 50 that is located to abut the locking element 18 when the locking-mechanism assembly 10 is in a locked position. The side support 48 is located adjacent to the handle 12 and assists in providing support and protection to the handle 12. The side support 48 also assists in constraining the rotation of the handle 12.

The locking-mechanism assembly 10 further includes a plurality of guiding shafts 54a, 54b and plurality of springs 56a, 56b. The plurality of guiding shafts 54a, 54b and the plurality of springs 56a, 56b form a biasing element. Each of the plurality of springs 56a, 56b surrounds a respective one of the outer surfaces of the plurality of guiding shafts 54a, 54b. Each of the plurality of guiding shafts 54a, 54b and the plurality of springs 56a, 56 extends through a respective one of the apertures formed in a plate 58 of the locking assembly 16. The plurality of guiding shafts 54a, 54b and the plurality of springs 56a, 56 assist in biasing or maintaining the positioning of the locking assembly 16 during movement between the unlocked and locked positions.

Figure 4A:
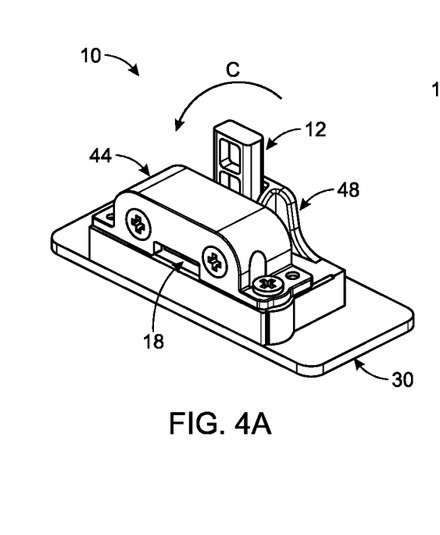
FIG. 4A is a perspective view of the locking-mechanism assembly of FIG. 1A in the unlocked position about to be moved to the locked position.
Figure 4B:
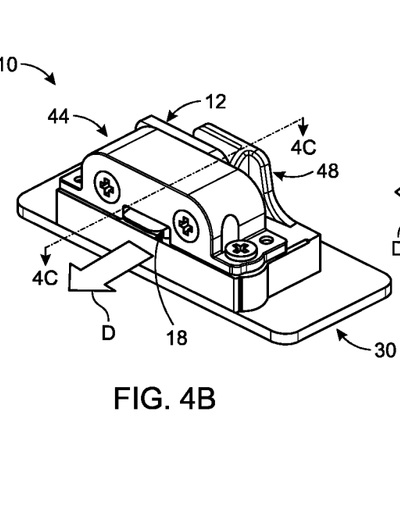
FIG. 4B is a perspective view of the locking-mechanism assembly of FIG. 1B in a locked position.
Figure 4C:
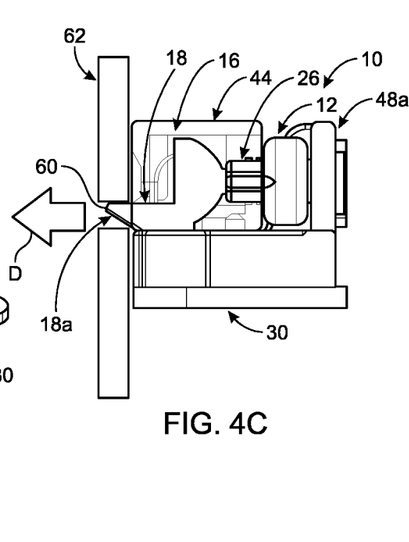
FIG. 4C is a general cross-sectional view of the locking-mechanism assembly of FIG. 4B taken generally across line 4C-4C.

Referring to FIGS. 4A-4C, various views of the locking-mechanism assembly 10 are shown going from an unlocked position to a locked position. Specifically, FIG. 4A shows the locking-mechanism assembly 10 in an unlocked position, while FIGS. 4B, 4C show the locking-mechanism assembly 10 in a locked position. For improved clarity, the top cover 44 in FIG. 4C is shown as being clear or translucent.

According to one method, a user initially grasps the handle 12 and moves it in a counter-clockwise direction (arrow C in FIG. 4A). The handle 12 is initially in a generally vertical position (FIG. 4A) before being moved in a counter-clockwise direction (arrow C) to a generally horizontal position (FIGS. 4B, 4C). By using rotation locking, it is much easier to activate because rotational motion saves forces in moving a locking element. In this method, the handle 12 is moved in the absence of tooling. Thus, this method is a toolless operation.

In cooperation with the shaft 26, the locking-mechanism assembly 10 moves from the unlocked position to the locked position (FIGS. 4B, 4C). As shown in FIG. 4C, an end portion 18a of the locking element 18 extends into or through an opening 60 formed in a mounting panel 62. The locking element 18 moves in the direction of arrow D in FIGS. 4B, 4C. In one embodiment, the locking element 18 continues to move in the direction of arrow D with the end portion 18a of the locking element 18 extending completely through the opening 60 in the mounting panel 62.

It is contemplated that the locking-mechanism assemblies may secure other items or components than a mounting panel. For example, the locking mechanism assemblies may secure components such as modules, covers, panels, doors, moving parts, moving modules, etc. The locking-mechanism assemblies can be used on virtually any type of mechanical device that needs to be secured in position. The locking-mechanism assembly helps secure removable parts in limited space.

Figure 5A:
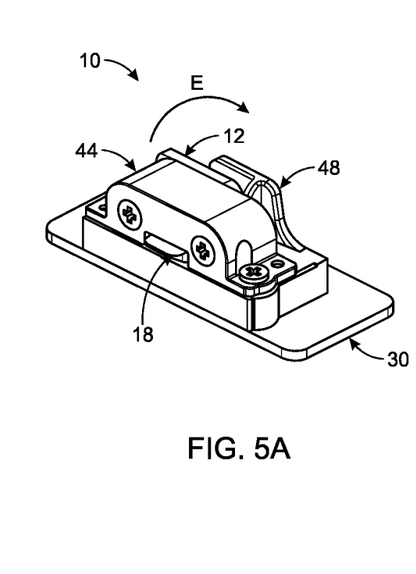
FIG. 5A is a perspective view of the locking-mechanism assembly of FIG. 1B in the locked position about to be moved to the unlocked position.
Figure 5B:
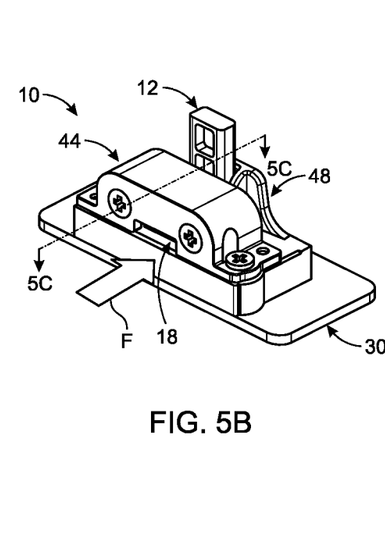
FIG. 5B is a perspective view of the locking-mechanism assembly of FIG. 1A in the unlocked position.
Figure 5C:
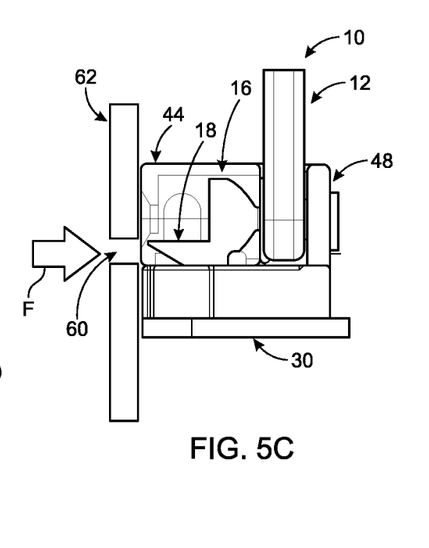
FIG. 5C is a general cross-sectional view of the locking-mechanism assembly of FIG. 5B taken generally across line 5C-5C.

Referring to FIGS. 5A-5C, various views of the locking-mechanism assembly 10 are shown going from a locked position to an unlocked position. Specifically, FIG. 5A shows the locking-mechanism assembly 10 in a locked position, while FIGS. 5B, 5C show the locking-mechanism assembly 10 in an unlocked position. For improved clarity, the top cover 44 in FIG. 5C is shown as being clear or translucent.

According to one method, a user initially grasps the handle 12 and moves it in a clockwise direction (arrow E in FIG. 5A). The handle 12 is initially in a generally horizontal position (FIG. 5A) before being moved in a clockwise direction (arrow E) to a generally vertical position (FIGS. 5B, 5C). The handle 12 is moved in the absence of tooling. Thus, this method is a toolless operation.

In cooperation with the shaft 26, the locking-mechanism assembly 10 moves from the locked position to the unlocked position (FIGS. 5B, 5C). As shown in FIG. 5C, no portion of the locking element 18 extends through the opening 60 formed in the mounting panel 62. The locking element 18 has moved in the direction of arrow F in FIGS. 5B, 5C.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation.

Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An axial-rotation locking-mechanism assembly comprising:
   a handle;
   a locking assembly including a locking element defining a cam end portion, the cam end portion has a general C-shaped exterior surface;
   a shaft operatively connected to the handle the shaft defining a main body and a plurality of extension extending from the main body configured to engage with the exterior surface of the cam end portion; and
   a biasing mechanism configured to bias the locking element,
   wherein when the handle is rotated in a first direction, the shaft is rotated in a first direction and moves along the exterior surface of the cam end portion to move the locking element in a first axial direction,
   wherein when the handle is rotated in a second direction, the shaft is rotated in a second direction and moves along the exterior surface of the cam end portion allowing the locking element to be biased in a second axial direction, the second direction being the opposite of the first direction, the first axial direction being the opposite of the second direction.

2. The locking-mechanism assembly of claim 1, further comprising a base.

3. The locking-mechanism assembly of claim 1, further comprising a housing.

4. The locking-mechanism assembly of claim 1, wherein the first direction is counter-clockwise.

5. The locking-mechanism assembly of claim 1, wherein the locking element comprises a metal.

6. The locking-mechanism assembly of claim 1, wherein the locking element comprises a polymeric material.

7. A method of locking and unlocking a component, the method comprising:
   providing the axial-rotation locking-mechanism assembly of claim 1;
   rotating the handle in a first direction to cause the shaft being rotated in a first direction; and
   in response to rotating the handle, the shaft moving along the exterior surface of the cam end portion to move the locking element in an axial direction.

8. The method of claim 7, wherein the axial-rotation locking-mechanism assembly further includes a base.

9. The method of claim 7, wherein the axial-rotation locking-mechanism assembly further includes a housing.

10. The method of claim 7, wherein the first direction is counter-clockwise.

11. The method of claim 7, wherein the locking element comprises a metal.

12. The method of claim 7, wherein the locking element comprises a polymeric material.

* * * * *